United States Patent [19]
Takahashi

[11] Patent Number: 5,841,284
[45] Date of Patent: *Nov. 24, 1998

[54] APPARATUS FOR MONITORING POWER OF BATTERY TO SUPPLY ELECTRIC POWER TO LOAD

[75] Inventor: Susumu Takahashi, Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 494,059

[22] Filed: Jun. 23, 1995

[30] Foreign Application Priority Data

Nov. 11, 1994 [JP] Japan ......................................... 277288

[51] Int. Cl.$^6$ .......................... G01N 27/416; G01R 31/36
[52] U.S. Cl. ............................................. 324/428; 324/427
[58] Field of Search ..................... 324/426, 427, 324/428; 320/48; 340/636

[56] References Cited

U.S. PATENT DOCUMENTS

| | | | |
|---|---|---|---|
| 4,323,849 | 4/1982 | Smith | 324/428 |
| 4,679,000 | 7/1987 | Clark | 324/428 |
| 4,740,754 | 4/1988 | Finger | 324/428 |
| 4,931,737 | 6/1990 | Hishiki | 324/431 |
| 5,099,209 | 3/1992 | Seki et al. | 324/428 |
| 5,451,881 | 9/1995 | Finger | 324/427 |
| 5,648,717 | 7/1997 | Uskali | 324/428 |

FOREIGN PATENT DOCUMENTS

| | | |
|---|---|---|
| 4-36817 | 2/1992 | Japan . |
| 5-72303 | 3/1993 | Japan . |

*Primary Examiner*—Glenn W. Brown
*Attorney, Agent, or Firm*—Nikaido, Marmelstein, Murray & Oram LLP

[57] ABSTRACT

A micro discharge detection current which is obtained by reducing a discharge current of a battery at a predetermined ratio is detected by a current amplifying circuit and an integration voltage showing a discharge charge amount is formed by charging a capacitor of an integrating circuit. The integration voltage of the integrating circuit is compared with a reference voltage showing a predetermined unit charge amount by a comparing circuit. When the integration voltage reaches the reference voltage, a comparison output is inverted and the capacitor of the integrating circuit is discharge reset and one pulse signal showing the unit charge amount is generated by the inversion of the comparison output. The pulse signal from the comparing circuit is counted by a counter and the count value is multiplied with the unit charge amount, thereby obtaining the present discharge charge amount of the battery.

4 Claims, 8 Drawing Sheets

APPARATUS FOR MONITORING POWER OF BATTERY TO SUPPLY ELECTRIC POWER TO LOAD

BACKGROUND OF THE INVENTION

The present invention relates to a monitoring apparatus for monitoring a charge amount of a battery which is used for information processing equipment such as a personal computer of a notebook type or the like and, more particularly, to an apparatus for monitoring a charge amount of a battery in order to accurately notify the user of an operable time of equipment by the battery to the user.

In recent years, in association with the spread of portable or lap-top type information processing equipment, an apparatus which operates by using a battery as a power source is needed. In such information processing equipment, in order to assure a validity of data stored in a memory or disk, a normal finishing process of a program which is being executed, a data storing process, and similar procedures must be completed a predetermined time before the battery power is fully consumed and the power source is turned off. When the equipment operates by using the battery as a power source, therefore, it is necessary to notify the present residual capacity of the battery to the user. Since the capacity of the battery cannot be directly measured, however, it is necessary to detect charge and discharge currents of the battery and to convert to a charge amount and to monitor it. Such a charge amount of the battery is referred to as a capacity of the battery.

FIG. 1 shows a typical circuit construction of a conventional power capacity monitoring apparatus. For simplicity of explanation, FIG. 1 shows a circuit of a discharge current of a battery. A circuit construction of a charge current is similar to that of the discharge current except that the direction of the current is opposite.

In FIG. 1, in order to measure a discharge current flowing from a battery 10 to a load 12, a micro current detection resistor Rs is serially inserted into a discharge line. Although the current detection resistor Rs is inserted to the line on the positive electrode side of the battery 10, it can be also inserted to the line on the negative electrode side. A voltage V1 generated across the current detection resistor Rs is proportional to a discharge current Id which flows through the current detection resistor Rs. The detection voltage V1 is amplified by an operational amplifier 40, the amplified voltage is converted to a digital value by an A/D converter 42, and the digital value is read by a control MPU 22. Thus, a discharge current value at a certain moment can be known by the control MPU 22. Since it is a battery capacity that is actually measured, a current value (ampere) must be converted to a capacitance value (coulomb). In the conventional apparatus, the discharge current is measured every predetermined time by a program of the control MPU 22 and a time integration value (current×time) is obtained by a numerical value calculation, thereby obtaining the capacity value of the battery.

In such a conventional battery capacity monitoring apparatus, however, there are the following problems. First of all, the load current always fluctuates depending on an operating state of a circuit or a disk apparatus as a load. Therefore, an error due to a dynamic fluctuation of the load occurs in an interval time to measure the discharge current of the battery. The error increases as the interval time is long and the dynamic fluctuation of the load is large. In order to solve the problem of such an error, it can be considered to reduce the interval time of the current detection to a short enough time that the error doesn't cause a problem. In this case, however, an arithmetic operation error by the integration calculation is increased. That is, in the control MPU 22, although the current and time are multiplied by a binary arithmetic operation, an operation error occurs each time the operation is executed once. Since the number of arithmetic operations increases as the interval time is reduced, the arithmetic operation error also increases. Since a complicated arithmetic operation routine such as a floating-point arithmetic operation cannot be usually used due to a capacity limitation of a program memory or the like and the multiplication can be executed only by using integers, the selection of the interval time is accordingly limited and such a time cannot be minimized. Further, in the conventional apparatus, since the measurement data is inputted to the control MPU 22, the A/D converter 42 to convert the analog detection voltage to the digital value is certainly needed. Although an A/D converter of a wide bit width has to be used in order to reduce a quantization error of the A/D converter 42, it causes an increase in costs. On the other hand, although there is an MPU having an A/D converter therein or the like, a bit width of such an MPU is usually limited to 8 to 12 bits and there is a limitation in reduction of the quantization error.

SUMMARY OF THE INVENTION

According to the invention, an apparatus which can accurately monitor a capacity of a battery by tracing a dynamic fluctuation of a load current without needing to use an A/D converter.

According to the invention, first, a discharge charge amount of a battery is obtained from a discharge current of the battery. Discharge current detecting means detects the discharge current of the battery. The discharge detection current outputted from the discharge current detecting means is integrated by integrating means, thereby obtaining the discharge charge amount. The discharge charge amount obtained by the integrating means is compared with a predetermined unit charge amount by comparing means. When the discharge charge amount reaches the unit charge amount, the discharge charge amount of the integrating means is reset to zero and one count signal is generated. The count signal outputted by the comparing means is counted by measuring means and the discharge charge amount of the battery is measured on the basis of the count value.

Specifically speaking, the discharge current detecting means is a current amplifying circuit for generating a micro discharge detection current which is obtained by reducing the discharge current of the battery at a predetermined ratio. The integrating means is an integrating circuit for charging a capacitor by the discharge detection current of the current amplifying circuit and forming an integration voltage. Further, the comparing means is a comparing circuit for discharge resetting the integrating circuit and outputting one pulse signal when the integration voltage of the integrating circuit reaches a reference voltage showing a unit charge amount.

In the integrating circuit, a capacitor in which a change ratio of capacitance has a positive temperature coefficient and a capacitor in which a change ratio of capacitance has a negative temperature coefficient are connected in parallel, thereby suppressing a capacitance change due to a temperature. The measuring means obtains a discharge charge amount of the battery by multiplying the count value derived by counting up the count signal from the comparing means with the unit charge amount. Further, in the case where the charged charge amount when the battery is fully charged has preliminarily been known, the value which is derived by subtracting the measured discharge charge amount from the charged charge amount is obtained as a present capacity of the battery.

According to the invention, the charged charge amount of the battery is obtained from a charge current Ic of the battery. Charge current detecting means detects the charge current of the battery. The charge detection current outputted from the charge current detecting means is integrated by the integrating means, thereby obtaining the charged charge amount. The charged charge amount obtained by the integrating means is compared with a predetermined unit charge amount by the comparing means. When the charged charge amount reaches the unit charge amount, the charged charge amount of the integrating means is reset to zero and one count signal is generated. The count signal outputted by the comparing means is counted by the measuring means and the charged charge amount of the battery is obtained on the basis of the count value. Specifically speaking, the charge current detecting means is a current amplifying circuit for generating a micro charge detection current which is obtained by reducing the charge current of the battery at a predetermined ratio. The integrating means is an integrating circuit for charging a capacitor by the charge detection current of the current amplifying circuit and forming an integration voltage. The comparing means is a comparing circuit for discharge resetting the integrating circuit and outputting one pulse signal when the integration voltage of the integrating circuit reaches a reference voltage showing the unit charge amount.

In this case as well, in the integrating circuit, a capacitor in which a change ratio of capacitance has a positive temperature coefficient and a capacitor in which a change ratio of capacitance has a negative temperature coefficient are connected in parallel, thereby suppressing a capacitance change due to a temperature. The measuring means obtains the charged charge amount of the battery by multiplying the count value obtained by counting up the count signal from the comparing means with the unit charge amount.

Further, according to the invention, the present charge amount of the battery is obtained by measuring each of the discharge charge amount and the charged charge amount of the battery. For this purpose, the current detecting means, integrating means, and comparing means are provided for each of the discharge current and the charge current of the battery. The capacity of the battery is measured by the measuring means on the basis of the count signal outputted from the comparing means. Namely, the value obtained by subtracting the count value of the output signal from the comparing means for the discharge current from the count value of the output signal from the comparing means for the charge current is multiplied with the unit charge amount, thereby obtaining the present charge amount of the battery. The present charge amount of the battery can be also obtained by multiplying the unit charge amount to the count value which is counted up by the output signal from the comparing means for the charged current and is counted down by the output signal from the comparing means for the discharge current.

In the invention, the discharge current or charge current is detected as one "unit" every predetermined charge amount and the number of units is counted, thereby detecting an amount of charges which flow out from the battery and an amount of charges which flow into the battery. When the discharge current Id is explained as an example, since the charge amount is obtained by the integration of a discharge current Id(t) which changes with an elapse of time, a pulse is generated at a timing such that an area (S) formed by the discharge current Id(t) in the two-dimensional coordinates of a time base (axis) and a discharge current base (axis), namely, a charge amount (S) becomes constant. In this instance, the charge amount (S) is expressed as follows.

$$S = \int_0^T Id(t)dt \tag{1}$$

A voltage Vs(t) across a capacitor (C) when a micro detection current Is(t) obtained by reducing the discharge current Id(t) at a predetermined ratio is outputted by the current amplifying circuit and the capacitor (C) in the integrating circuit is charged by the detection current Is(t) is expressed as follows.

$$Vs(t) = \frac{1}{C} \int_0^T Is(t)dt = \frac{A}{C} \int_0^T Is(t)dt \tag{2}$$

Therefore, the charge amount (S) is obtained as follows.

$$S = \frac{C \cdot Vs(t)}{A} \tag{3}$$

Since (A) and (C) are constants, in order to make the charge amount (S) constant, it is sufficient to execute a voltage detection so that the voltage Vs(t) across the capacitor is constant. That is, a terminal voltage of the capacitor (C) of the integrating circuit is compared by the comparing circuit with a reference voltage Vref which gives a predetermined unit charge amount. The capacitor is quickly discharged by resetting each time the capacitor is charged up to the reference voltage Vref. By counting the number of such operations, the discharge charge amount can be measured. When an initial charged charge amount of the battery has previously been known, the present residual charge amount of the battery can be known by subtracting the discharge charge amount from the initial charged charge amount.

With respect to the charge current Ic of the battery as well, the above construction is fundamentally the same as that mentioned above except that the current direction is opposite. That is, the terminal voltage of the capacitor (C) in the integrating circuit is compared with the reference voltage Vref which gives a predetermined unit charge amount by the comparing circuit. The capacitor is quickly discharged by resetting each time it is charged up to the reference voltage Vref. The charged charge amount can be measured by counting the number of such operations and the charged charge amount of the battery when the charging is finished can be known.

Further, by measuring both of the discharge charge amount and the charged charge amount, the present residual charge amount can be accurately known.

The above and other objects, features, and advantages of the present invention will become more apparent from the following detailed description with reference to the drawings.

DETAILED DESCRIPTION OF THE PREFERRED EMBODIMENTS

Figure 1:
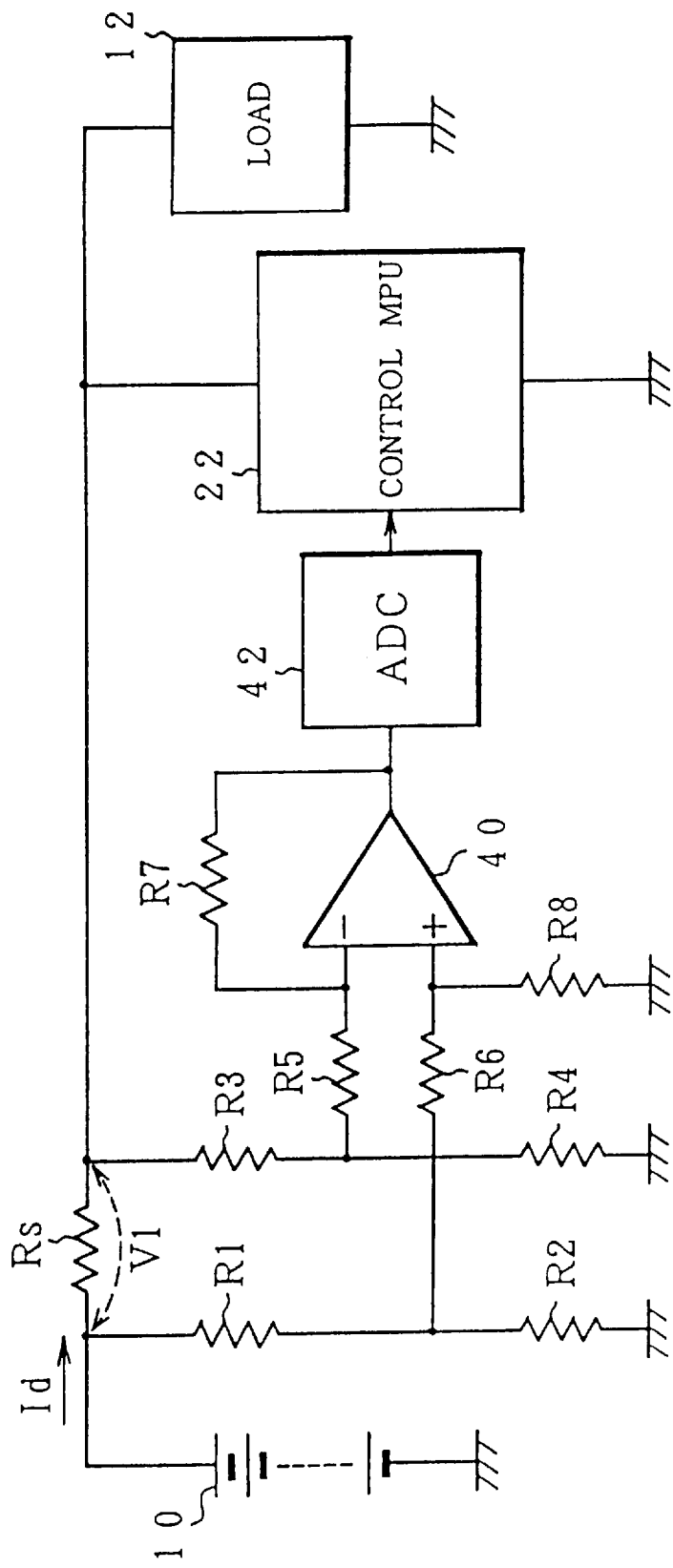
FIG. 1 is a circuit diagram of a conventional apparatus.
Figure 2:
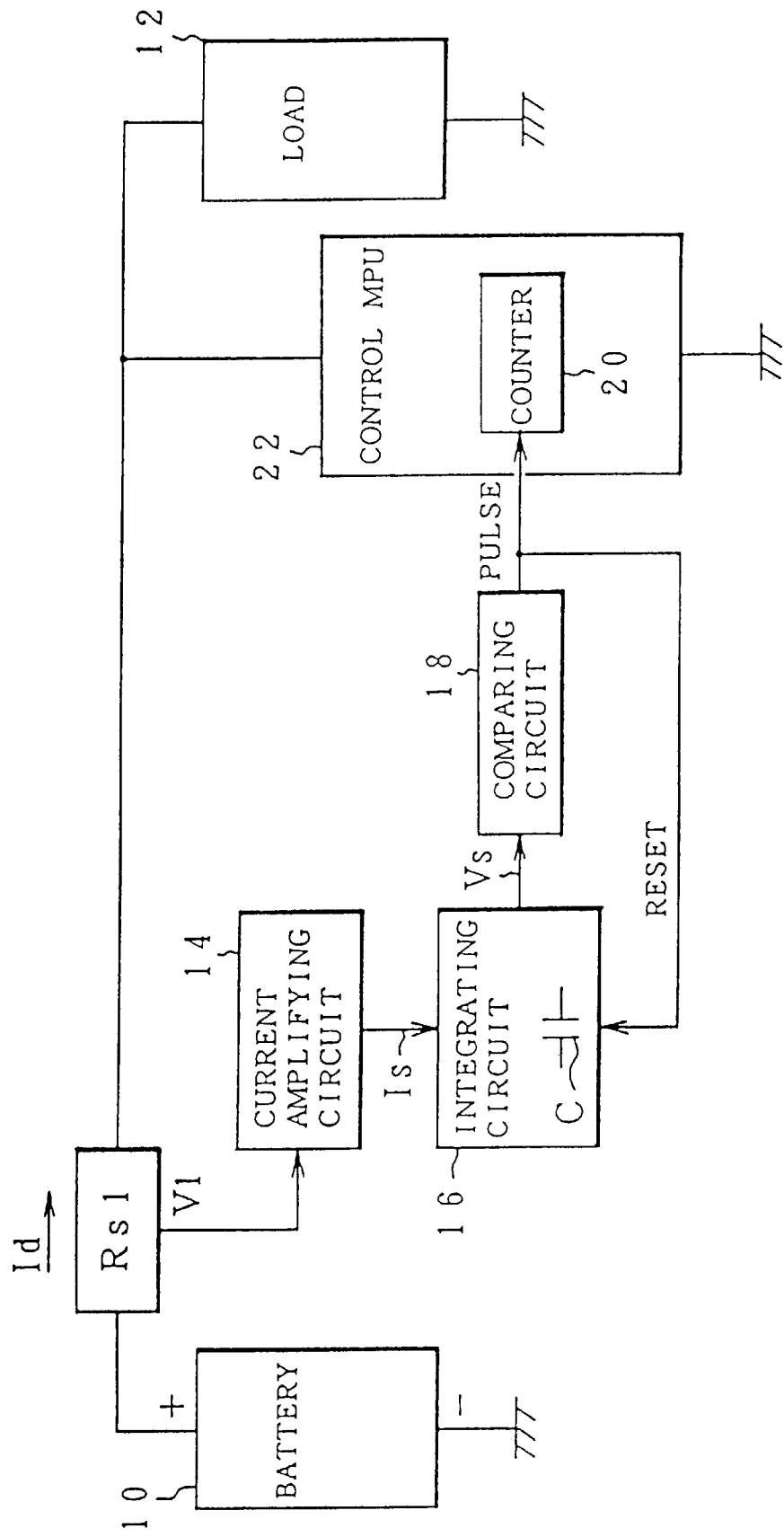
FIG. 2 is a block diagram of the first embodiment of the invention to detect a discharge capacitance of a battery.

FIG. 2 is a block diagram of the first embodiment of the invention. The first embodiment is characterized in that a charge amount of a battery is monitored on the basis of a discharge current of the battery. In FIG. 2, the battery 10 supplies a power source to the load 12. The power supply voltage of the battery 10 is equal to, for example, DC 5 V. A battery capacity monitoring apparatus comprises a current detection resistor Rs1, a current amplifying circuit 14, an integrating circuit 16, a comparing circuit 18, and a counter 20 which is realized by a program control of the control MPU 22. The current detection resistor Rs1 is a micro resistor of, for example, about 50 mΩ and generates the detection voltage V1 across the resistor according to the discharge current Id. The following relation is obtained in this instance.

$$V1 = Rs1 \times Id$$

The current amplifying circuit 14 inputs the detection voltage V1 of the current detection resistor Rs1 and outputs the micro detection current Is which is obtained by reducing the discharge current Id at a predetermined ratio to the integrating circuit 16. The integrating circuit 16 has the capacitor (C) which is charged by the detection current Is from the current amplifying circuit 14. A voltage Vs across the capacitor (C) of the integrating circuit 16 is supplied to the comparing circuit 18 and is compared with the predetermined reference voltage Vref showing a unit charge amount. When the voltage Vs across the capacitor (C) reaches the reference voltage Vref, an output of the comparing circuit 18 is inverted from the (L) level to the (H) level. When the output of the comparing circuit 18 is inverted from the (L) level to the (H) level, the inverted (H) level output is supplied as a reset signal to the integrating circuit 16 and the capacitor (C) is immediately discharged and is set into a resetting state. As a result, each time the voltage Vs across the capacitor (C) of the integrating circuit 16 reaches the reference voltage Vref of the comparing circuit 18, one pulse signal indicating that the unit charge amount is obtained is outputted from the comparing circuit 18. The counter 20 is provided for the control MPU 22 and counts the number of pulse signals outputted from the comparing circuit 18. The value of the counter 20 indicates the number of detected unit charge amounts. By multiplying the count value of the counter 20 with the unit charge amount, the control MPU 22 can obtain the discharge charge amount from the battery 10.

FIG. 3A shows an example of a time-dependent change in discharge current Id from the battery 10 in FIG. 2. The discharge current Id variously changes according to a state of the load 12. For such a change in discharge current Id, the detection current Is which is proportional to the discharge current Id is outputted from the current amplifying circuit 14 to the integrating circuit 16 and the capacitor (C) is charged. The voltage Vs across the capacitor (C) is compared with the reference voltage Vref by the comparing circuit 18. When the voltage Vs reaches the reference voltage Vref, the comparison output is inverted from the (L) level to the (H) level, thereby discharge resetting the capacitor (C) in the integrating circuit 16. One pulse signal of FIG. 3B is generated from the comparing circuit 18. The integrating circuit 16 and comparing circuit 18 time integrate the discharge current Id. When an area (S) shown in the diagram which gives the integration amount, namely, the charge amount of the capacitor (C) reaches a predetermined unit charge amount which is determined by the reference voltage Vref, the pulse signal is outputted from the comparing circuit 18. Such a relation is as shown by the above expressions (1) to (3). As a result, the pulse signal outputted from the comparing circuit 18 shows the constant area (S), namely, the constant charge amount when the discharge current Id which changes with the elapse of time is integrated. Thus, the number of constant unit charge amounts (S) can be known by counting the number of pulse signals by the counter 20. When the count value of the counter 20 is multiplied with the constant charge amount (S), the discharge charge amount of the battery 10 by the discharge current Id of the battery 10 can be known.

In the case where the charge amount when the battery 10 is fully charged has preliminarily been known, by subtracting a consumed capacitance obtained by multiplying the count value of the counter 20 with the constant charge amount (S) from the charge amount when the battery 10 is fully charged, the present residual charge amount in the battery 10 can be known in the control MPU 22. The control MPU 22 outputs a message or an alarm to the user when the charge amount of the battery is reduced to the preset value, thereby urging the normal finishing process of the program which is being executed or the data storing process.

Figure 4:
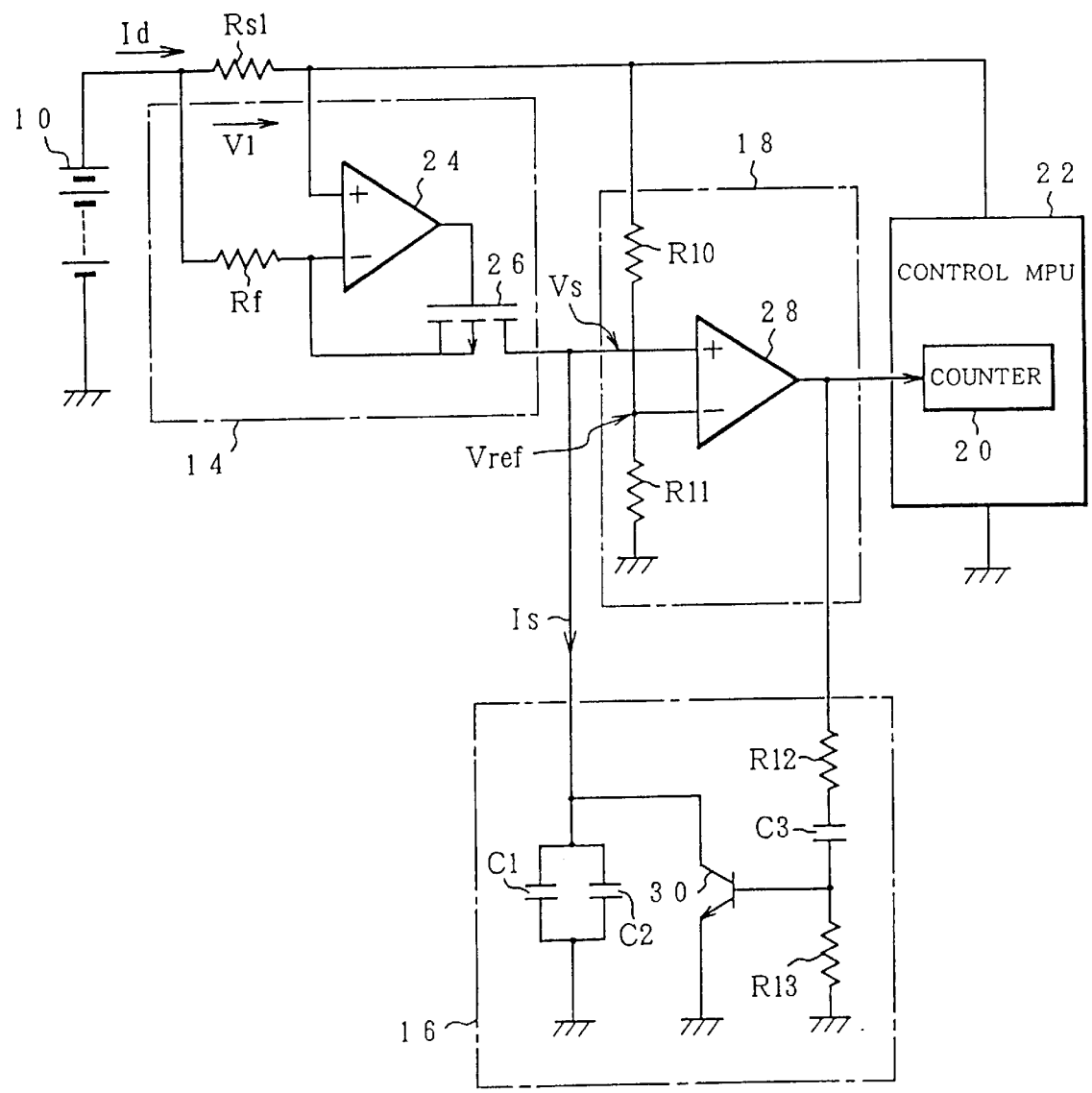
FIG. 4 is a specific circuit diagram of the first embodiment of FIG. 2.

FIG. 4 is a specific circuit diagram in FIG. 2. An operational amplifier 24 and an MOS type FET 26 are provided for the current amplifying circuit 14. The operational amplifier 24 supplies the detection voltage V1 according to the discharge current Id of the current detection resistor Rs through an input resistor Rf. The detection current Is flowing in the integrating circuit 16 by the driving of the FET 26 by the operational amplifier 24 is given by the following expression.

$$Is = (Rs1/Rf) \cdot Id \qquad (4)$$

Where, the current detection resistor Rs1 is a micro resistor with a resistance value of 50 mΩ. On the contrary, a resistor of a high resistance value of 10 kΩ is used as an input resistor Rf. The micro current detection voltage V1 is sufficiently amplified and the FET 26 is driven, thereby outputting the micro discharge detection current Is which is obtained by reducing the discharge current Id at a predetermined ratio (Rs1/Rf).

Figure 5:
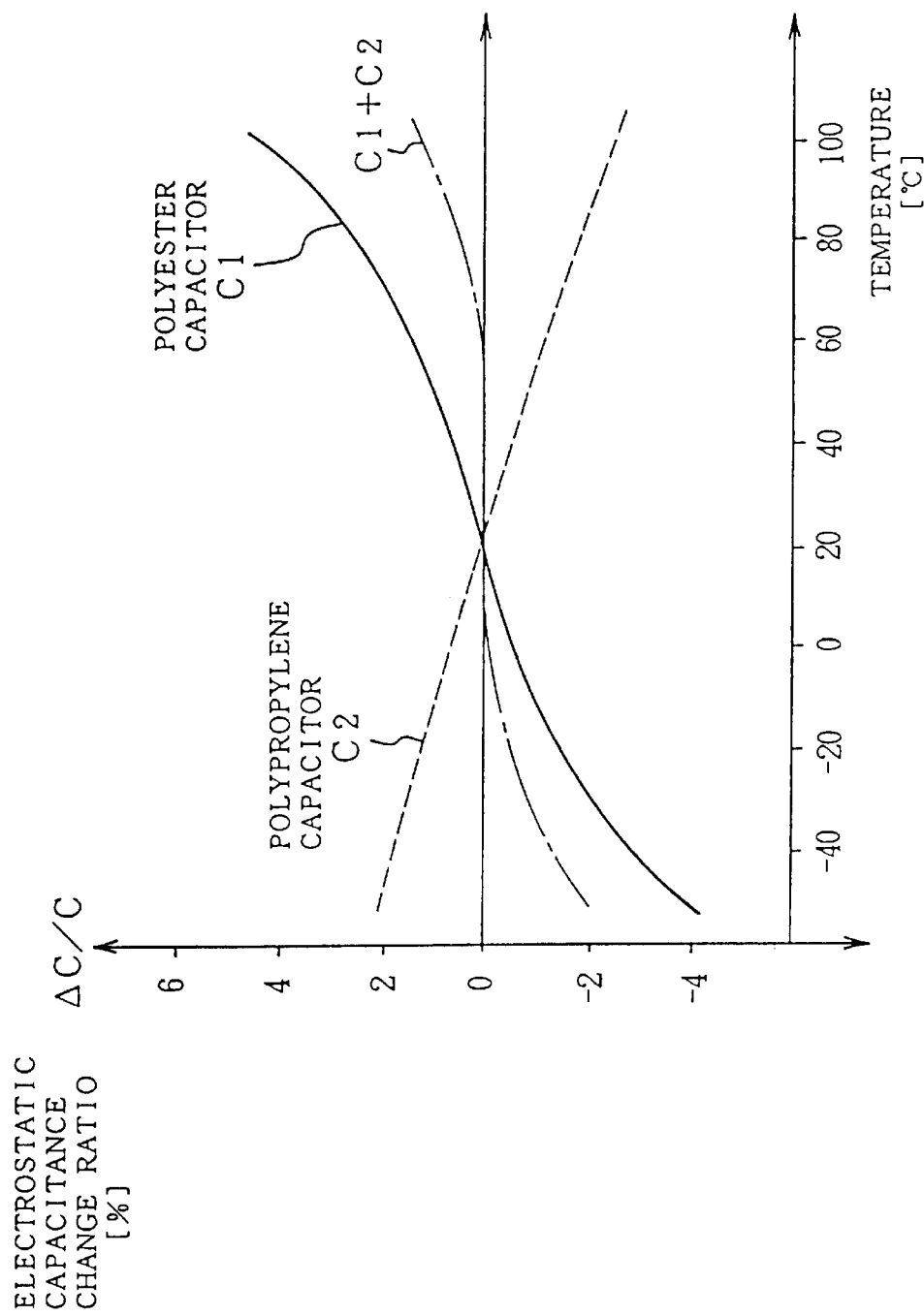
FIG. 5 is a characteristics diagram of a capacitance change ratio for a temperature of a capacitor used in an integrating circuit.

The integrating circuit 16 is constructed by: capacitors C1 and C2 which are connected in parallel; a transistor 30 for a discharge reset; and a differentiating circuit which is formed by serially connecting a resistor R12, a capacitor C3, and a resistor R13 and is used to drive the transistor 30. The capacitor C1 is a polyester capacitor having characteristics such that an electrostatic capacitance change ratio for a temperature is shown by a line C1 as shown in FIG. 5. On the other hand, the capacitor C2 is a polypropylene capacitor having characteristics such that an electrostatic capacitance change ratio for a temperature is shown by a broken line C2 in FIG. 5. By connecting such a polyester capacitor C1 and a polypropylene capacitor C2 in parallel, the capacitor C has characteristics shown by (C=C1+C2). Thus, an electrostatic capacitance change ratio for a temperature of the whole capacitor can be kept almost constant in a room temperature use range around 20° C. as a center like characteristics of (C1+C2) as shown by an alternate long and short dash line. Accordingly, the capacitance of the capacitor C which is used in the integrating circuit 16 can be always kept constant even if an ambient temperature changes. Since the capacitance of the capacitor C of the integrating circuit 16 doesn't change for the ambient temperature, consequently, a constant unit charge amount (S) can be accurately detected.

Referring again to FIG. 4, a comparator 28 is provided for the comparing circuit 18. A voltage Vs across a parallel connection circuit of the capacitors C1 and C2 provided in the integrating circuit 16 is inputted to a plus input terminal of the comparator 28. A reference voltage Vref which is obtained by dividing a voltage by resistors R10 and R11 and which is used to determine the constant charge amount (S) is inputted to a minus input terminal of the comparator 28. During the charging operation by the detection current Is after discharge resetting the capacitors C1 and C2, the voltage Vs across the capacitors is lower than the reference voltage Vref and an output of the comparator 28 is set to the (L) level. In this instance, the transistor 30 in the integrating circuit 16 is in the "off" state. When the voltage Vs across the capacitors reaches the reference voltage Vref, the output of the comparator 28 is inverted from the (L) level to the (H) level. By the inversion to the (H) level, a differential pulse is generated by the differentiating circuit of the resistor R12, capacitor C3 and resistor R13 of the integrating circuit 16 and the transistor 30 is instantaneously turned on. The charged charges of the capacitors C1 and C2 are rapidly discharged through the transistor 30 and the voltage Vs across the capacitors decreases to 0 V. Thus, the (H) level output of the comparator 28 is again inverted to the (L) level output. A pulse signal is outputted to the control MPU 22 by those level changes of L, H, and L of the output of the comparator 28 and the counting operation of the counter 20 is executed. Although the electrostatic capacitance change ratio for the temperature has been suppressed by connecting the polyester capacitor C1 and the polypropylene capacitor C2 in parallel to the integrating circuit 16 in the embodiment of FIG. 4, a single capacitor (C) can be also used in an apparatus of which temperature of a use environment is stable.

Figure 6:
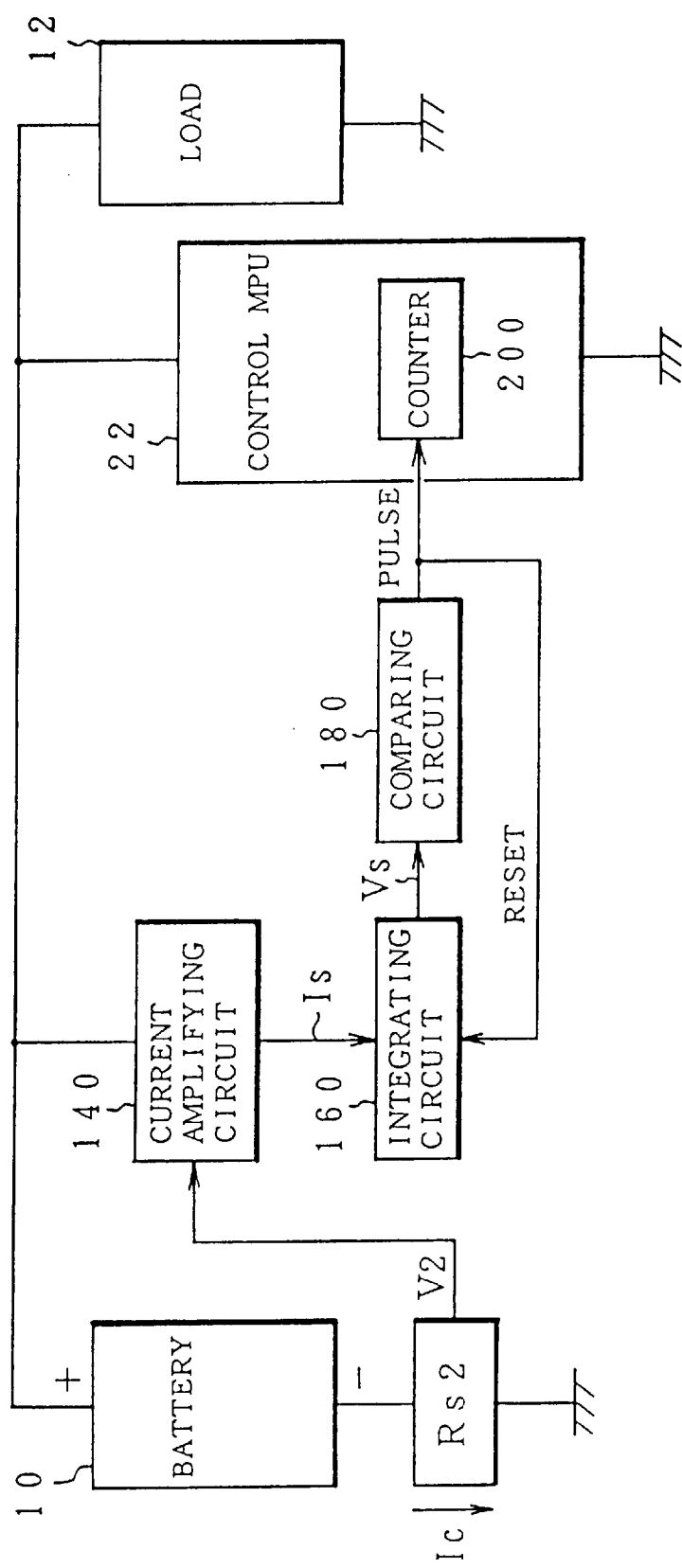
FIG. 6 is a block diagram of the second embodiment of the invention to detect a charge capacity of the battery.

FIG. 6 is a block diagram of the second embodiment of the invention and a charge amount is monitored on the basis of a charge current of the battery. In FIG. 6, a battery which can be charged by a supply of a DC power source from the outside is used as a battery 10. In the case where the energy in battery 10 is consumed, the battery 10 is charged by supplying a DC power source from the outside by, for example, connecting an AC adaptor or the like. In order to detect a charge current Ic which flows when the battery 10 is charged, a current detection resistor Rs2 is inserted to, for example, a power source line on the minus side of the battery 10. The current detection resistor Rs2 is a micro resistor with a resistance value of about 50 mΩ and generates a micro detection voltage V2 when the charge current Ic flows. The detection voltage V2 is inputted to a current amplifying circuit 140 and is converted to the micro charge detection current Ic which is obtained by degenerating the charge current Ic at a predetermined ratio. The detection current Is from the current amplifying circuit 140 charges the capacitor (C) provided for an integrating circuit 160. The voltage Vs across the capacitor (C) is inputted to a comparing circuit 180 and is compared with the reference voltage Vref showing a predetermined unit charge amount. When the voltage Vs across the capacitor (C) reaches the reference voltage Vref, an output of the comparing circuit 180 is inverted from the (L) level output so far to the (H) level output. The output of the comparing circuit 180 is fed back to the integrating circuit 160 as a reset signal. When the comparison output is inverted from the (L) level to the (H) level, the capacitor (C) is discharge reset. Thus, one pulse signal whose level changes like L, H, and L is outputted from the comparing circuit 180 and is counted by a counter 200 of the control MPU 22. As a result, the pulse signal outputted from the comparing circuit 180 shows the constant area (S), namely, constant charge amount when the charge current Ic which changes with the elapse of time is integrated. By counting the number of pulse signals by the counter 200, the number of constant charge amounts (S) can be known. When the count value of the counter 200 is multiplied with the constant charge amount (S), the charged charge amount of the battery 10 by the charge current Ic of the battery 10 can be accurately known. Namely, by detecting the charged charge amount at the time of charging after the battery 10 was fully consumed, the charge amount of the battery when the battery is started to be used after completion of the charging can be accurately known.

Figure 7:
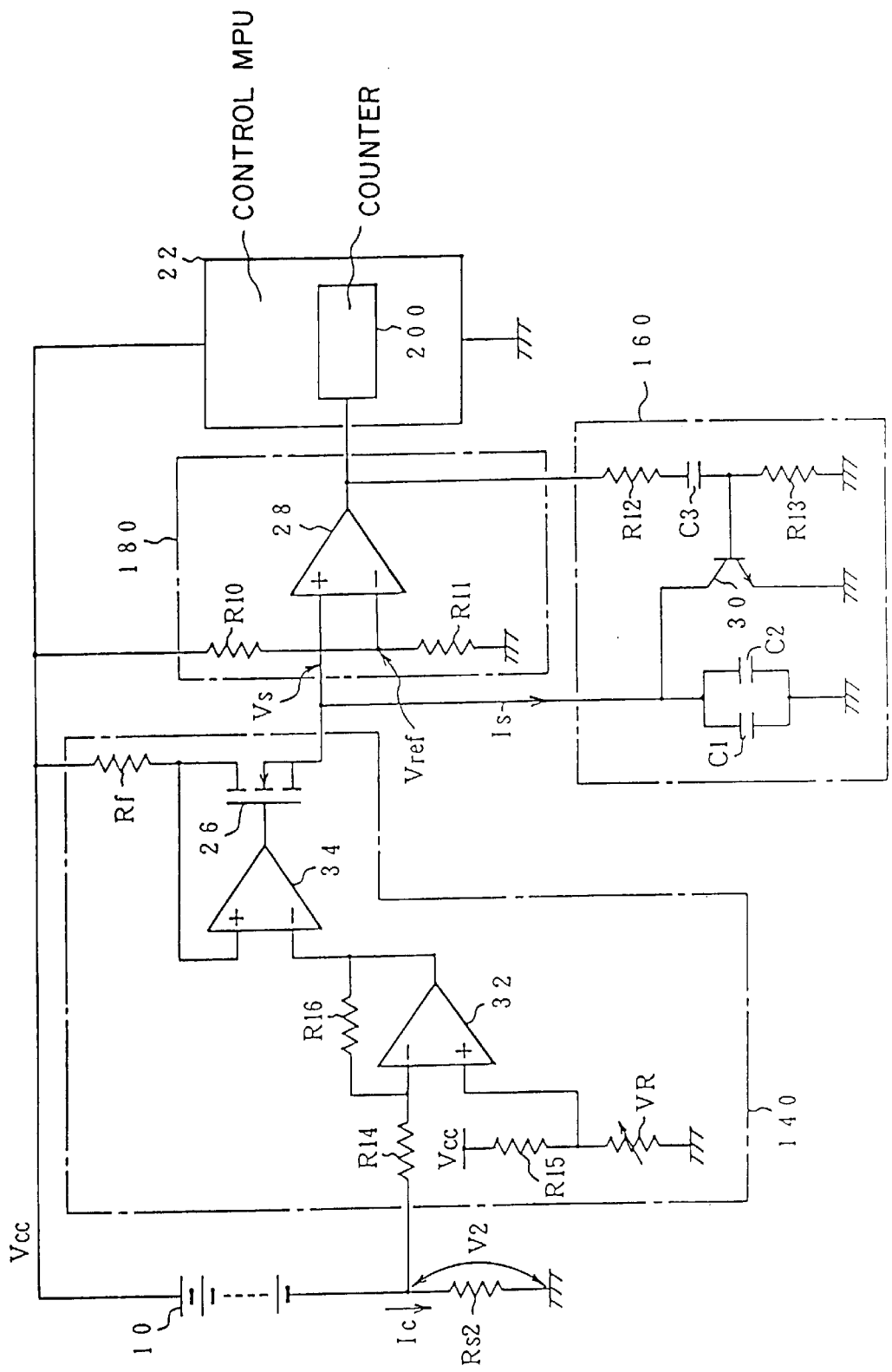
FIG. 7 is a circuit diagram specifically showing the second embodiment of FIG. 6.

Such the detection of the charge capacity based on the charge current Ic of the battery 10 is executed in fundamentally the same manner as that of the detection of the discharge charge amount of FIG. 2. Since the current direction of the discharge current Id is different from that of the charge current Ic, only a circuit construction of the current amplifying circuit 140 adapted to the detection voltage of a different polarity according to the current direction is different. FIG. 7 shows a specific circuit of FIG. 6. Operational amplifiers 32 and 34 and an FET 26 are provided for the current amplifying circuit 140. The detection voltage V2 of the current detection resistor Rs2 is supplied to a minus input terminal of the operational amplifier 32 through an input resistor R14. A threshold voltage Vth formed by a voltage dividing circuit comprising a resistor R15 and a variable resistor VR is inputted to a plus input terminal of the operational amplifier 32 for offset adjustment. When it is assumed that a power source voltage Vcc of the battery 10 is equal to 5 V, the threshold voltage Vth is set to 2.5 V which is the half value of the power source voltage Vcc. Resistance values of the input resistor R14 and a feedback resistor R16 are equal, so that the operational amplifier 32 operates as a voltage buffer having an offset adjusting function. An output voltage V0 of the operational amplifier 32 is obtained by the following expression.

$$V0 = 2 \cdot Vth - V2 \tag{5}$$

The output of the operational amplifier 32 is connected to a minus input terminal of the operational amplifier 34. In the operational amplifier 34, the input resistor Rf is connected to a plus input terminal and the FET 26 is connected to the output. The operational amplifier 34 drives the FET 26 so as to output the detection current Is which is proportional to the charge current Ic of the battery 10. That is, the operational amplifier 34 flows the detection current Is according to the following expression.

$$Is = V1/Rf = (Ic \cdot Rs2)/Rf = (Rs2/Rf) \cdot Ic \tag{6}$$

In operation, the operational amplifier 34 drives the FET 26 so that the voltage across the input resistor Rf coincides with the detection voltage V2 of the current detection resistor Rs and the micro charge detection current Is which is obtained by reducing the charge current Ic at only a predetermined ratio ($RS^2/Ic$) flows. The integrating circuit 160 and comparing circuit 180 are substantially the same as the integrating circuit 16 and comparing circuit 18 in case of the discharge capacity detection of FIG. 4.

Figure 3:
FIGS. 3A and 3B are explanatory diagrams of a detection principle of the first embodiment.
Figure 8:
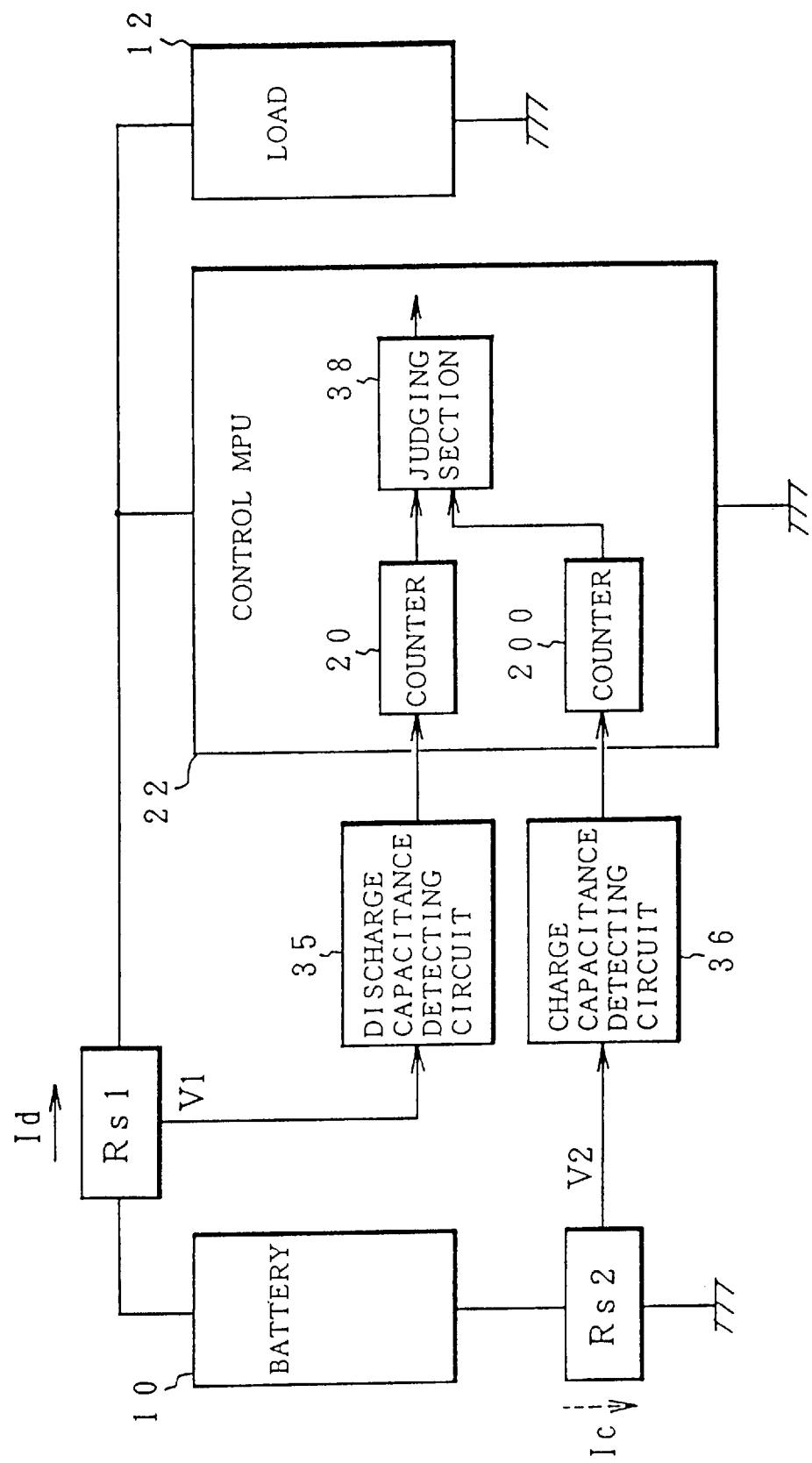
FIG. 8 is a block diagram of the third embodiment of the invention to detect both of a discharge capacitance and a charge capacitance of the battery.

FIG. 8 is a block diagram of the third embodiment of the invention in which both of the detection of the discharge charge amount of the battery in FIGS. 2 and 3 and the detection of the charged charge amount of the battery in FIGS. 6 and 7 are adopted. In FIG. 8, the current detection resistor Rs1 for detecting the discharge current Id which flows into the load 12 is inserted to a power source line on the plus side of the battery 10 and the detection voltage V1 is inputted to a discharge capacitance detecting circuit 35. The details of the discharge capacitance detecting circuit 35 are as shown in FIGS. 2 and 4. The current detection resistor Rs2 for detecting the charge current Ic which flows when the battery 10 is charged is inserted on the minus line side of the battery 10. The detection voltage V2 of the charge current Ic detected by the current detection resistor Rs is inputted to a charge capacitance detecting circuit 36. The details of the charge capacitance detecting circuit 36 are as shown in FIGS. 6 and 7. The counters 20 and 200 are provided for the control MPU 22. The counter 20 counts the number of pulse signals each of which is obtained each time the discharge of the predetermined unit charge amount is detected by the discharge capacitance detecting circuit 35. The counter 200 counts the number of pulse signals each of which is obtained each time the charge of the predetermined unit charge is detected by the charge capacitance detecting circuit 36. Therefore, the value obtained by multiplying the count value of the counter 20 with the constant unit charge amount (S) is equal to the discharge charge amount of the battery 10. The value obtained by multiplying the count value of the counter 200 with the constant unit charge amount (S) is equal to the charged charge amount of the battery 10. A judging section 38 obtains the charge amount of the battery 10 at the present time point from the discharge count value of the counter 200 and the charge count value of the counter 20. That is, the present charge amount of the battery is obtained by multiplying the constant unit charge amount to the value derived by subtracting the count value of the counter 20 from the count value of the counter 200. When the charge amount of the battery decreases to a specified value, an instruction to promote a normal finishing process or a storing process to the memory is given to the user by a message or an alarm output. The charged charge amount, discharge charge amount, and further, the present residual charge amount of the battery 10 can be also displayed as necessary by using a display or an exclusive-use display section.

The present charge amount of the battery can be also obtained in a manner such that one up/down counter is provided in place of the counters 20 and 200, the up/down counter counts up by the pulse signal from the charge capacitance detection circuit 36 and counts down by the pulse signal of the discharge capacity detecting circuit 35, and the count value is multiplied with the predetermined unit charge amount.

Thus, since the discharge capacity of the battery can be accurately detected by tracing a dynamic fluctuation of the discharge current for the load, the detection accuracy of the battery capacity is remarkably improved and the monitoring process of the residual amount of the battery can be properly executed. Since there is no need to use an A/D converter even when the battery is monitored by a processor or a control logic, the accuracy is not influenced by a resolution of the A/D converter and the apparatus can be also realized at low costs.

Although the counter for counting the pulse signal obtained every predetermined unit charge amount at the time of the charge or discharge has been realized by a program function of the control MPU 22 in the above embodiment, an exclusive-use counter can be also provided as an external circuit of the control MPU 22.

Although the current detection resistor Rs1 has been provided for the power source line on the plus side of the battery 10 in the embodiments of the discharge capacitance detection of FIGS. 2 and 4, it can be also inserted to the power source line on the minus side. Although the current detection resistor Rs has been inserted to the power source line on the minus side on the battery 10 with respect to the detection of the charge amount of FIGS. 6 and 7, it can be also inserted to the power source line on the plus side.

The present invention is not limited to the foregoing preferred embodiments but incorporates many modifications and variations within the spirit and scope of the appended claims of the invention without departing from the objects thereof.

What is claimed is:

1. An apparatus for monitoring power of a battery which supplies an electric power to a load, said apparatus comprising:

a micro current detection resistor Rs1 which is inserted in a signal line connecting a plus terminal of said battery and said load such that current flow through said resistor generates a detection voltage V1 across said resistor that is proportional to a battery discharge current Id flowing from said battery to said load;

a current converting circuit having an operational amplifier to which said detection voltage generated across said current detection resistor is inputted through an input high resistor Rf, said current converting circuit including an FET which is driven by an output of said operational amplifier and which outputs a micro discharge detection current Is which is derived by multiplying said battery discharge current Id with a ratio Rs1/Rf;

an integrating circuit for charging a capacitor by the discharge detection current Is of said current converting circuit and forming an integration voltage;

a comparing circuit for resetting said integrating circuit and outputting one pulse signal when the integration voltage of said integrating circuit reaches a reference voltage indicative of a unit charge amount; and a measuring unit for counting the number of pulse signals outputted from said comparing circuit and generating a count value, and measuring the discharge charge amount of the battery on the basis of said count value.

2. An apparatus according to claim 1, wherein in said integrating circuit, a capacitor in which an electrostatic capacitance change ratio has a positive temperature coefficient and a capacitor in which an electrostatic capacitance change ratio has a negative temperature coefficient are connected in parallel, thereby suppressing a capacitance change due to a temperature.

3. An apparatus according to claim 1, wherein said measuring unit obtains the discharge charge amount of the battery by multiplying the count value which is derived by counting up the pulse signals from said comparing circuit with said unit charge amount.

4. An apparatus according to claim 1, wherein when a charged charge amount when said battery is fully charged has been determined, said measuring unit further obtains the value which is derived by subtracting said discharge charge amount from said charged charge amount as a present battery capacitance.

* * * * *